(12) United States Patent
Donofrio et al.

(10) Patent No.: US 8,575,633 B2
(45) Date of Patent: Nov. 5, 2013

(54) LIGHT EMITTING DIODE WITH IMPROVED LIGHT EXTRACTION

(75) Inventors: Matthew Donofrio, Raleigh, NC (US); Hua-Shuang Kong, Cary, NC (US); David Slater, Jr., Baskerville, VA (US); John Edmond, Durham, NC (US)

(73) Assignee: Cree, Inc., Durham, NC (US)

( * ) Notice: Subject to any disclaimer, the term of this patent is extended or adjusted under 35 U.S.C. 154(b) by 16 days.

(21) Appl. No.: 12/329,713

(22) Filed: Dec. 8, 2008

(65) Prior Publication Data

US 2010/0140636 A1    Jun. 10, 2010

(51) Int. Cl.
*H01L 33/00* (2010.01)
*H01L 27/15* (2006.01)
*H01L 31/12* (2006.01)

(52) U.S. Cl.
USPC ........... 257/98; 257/79; 257/88; 257/82; 257/83

(58) Field of Classification Search
USPC ......... 257/91, 95, 98, E33.006, E33.005, 99, 257/13, 79, 82, 88, 93, 96, 83, 89
See application file for complete search history.

(56) References Cited

U.S. PATENT DOCUMENTS

| | | | |
|---|---|---|---|
| 6,395,572 B1 * | 5/2002 | Tsutsui et al. | 438/46 |
| 6,504,180 B1 | 1/2003 | Heremans et al. | 257/99 |
| 6,547,249 B2 | 4/2003 | Collins et al. | |
| 6,552,369 B2 | 4/2003 | Chiou et al. | 257/98 |
| 6,563,141 B1 | 5/2003 | Dawson et al. | 257/98 |
| 6,784,462 B2 | 8/2004 | Schubert | 257/98 |
| 6,821,804 B2 | 11/2004 | Thibeault et al. | 438/29 |
| 6,833,565 B2 | 12/2004 | Su et al. | 257/98 |
| 6,967,981 B2 | 11/2005 | Chua et al. | 372/46 |
| 7,148,514 B2 | 12/2006 | Seo et al. | 257/79 |
| 7,261,454 B2 | 8/2007 | Ng | 362/555 |
| 7,384,809 B2 | 6/2008 | Donofrio | 438/29 |
| 7,622,742 B2 * | 11/2009 | Kim et al. | 257/79 |
| 7,683,377 B2 | 3/2010 | Nagai | 257/79 |

(Continued)

FOREIGN PATENT DOCUMENTS

| | | |
|---|---|---|
| DE | 102006041460 | 3/2008 |
| DE | 102007019776 | 10/2008 |
| EP | 0905797 | 3/1999 |
| EP | 1329961 | 7/2003 |

OTHER PUBLICATIONS

Lin et al. "Enhancement of InGaN-GaN Indium Tin Oxide Flip-Chip Light Emitting Diodes With $TiO_2$,-$SiO_2$, Multilayer Stack Omnidirectional Reflector", IEEE Photonics Technology Letters, vol. 18, No. 19, Oct. 1, 2006, pp. 2050-2052.

(Continued)

*Primary Examiner* — Chuong A. Luu
(74) *Attorney, Agent, or Firm* — Koppel, Patrick, Heybl & Philpott

(57) ABSTRACT

A light emitting diode is disclosed that includes an active region and a plurality of exterior surfaces. A light enhancement feature is present on at least portions of one of the exterior surfaces of the diode, with the light enhancement feature being selected from the group consisting of shaping and texturing. A light enhancement feature is present on at least portions of each of the other exterior surfaces of the diode, with these light enhancement features being selected from the group consisting of shaping, texturing, and reflectors.

44 Claims, 4 Drawing Sheets

(56) References Cited

U.S. PATENT DOCUMENTS

| | | | |
|---|---|---|---|
| 7,781,791 B2 * | 8/2010 | Sakai et al. | 257/98 |
| 2002/0139987 A1 | 10/2002 | Collins | |
| 2004/0016936 A1 * | 1/2004 | Tanaka et al. | 257/98 |
| 2004/0041222 A1 | 3/2004 | Loh | |
| 2005/0082562 A1 * | 4/2005 | Ou et al. | 257/103 |
| 2005/0104072 A1 | 5/2005 | Slater et al. | |
| 2005/0139252 A1 | 6/2005 | Shim | |
| 2005/0211989 A1 * | 9/2005 | Horio et al. | 257/79 |
| 2006/0006402 A1 | 1/2006 | Hsieh et al. | |
| 2006/0011935 A1 | 1/2006 | Krames et al. | 257/98 |
| 2006/0054907 A1 * | 3/2006 | Lai | 257/96 |
| 2006/0060874 A1 | 3/2006 | Edmond et al. | |
| 2006/0081858 A1 | 4/2006 | Lin et al. | |
| 2006/0186418 A1 | 8/2006 | Edmond et al. | |
| 2006/0273333 A1 * | 12/2006 | Wu et al. | 257/94 |
| 2006/0292804 A1 | 12/2006 | Seo et al. | |
| 2007/0018182 A1 * | 1/2007 | Beeson et al. | 257/98 |
| 2007/0018184 A1 * | 1/2007 | Beeson et al. | 257/98 |
| 2007/0109779 A1 | 5/2007 | Sekiguchi | |
| 2007/0145380 A1 | 6/2007 | Shum et al. | |
| 2007/0145392 A1 * | 6/2007 | Haberern et al. | 257/97 |
| 2007/0202624 A1 * | 8/2007 | Yoon et al. | 438/29 |
| 2008/0157115 A1 * | 7/2008 | Chuang et al. | 257/99 |
| 2008/0179602 A1 | 7/2008 | Negley et al. | |
| 2008/0211416 A1 | 9/2008 | Negley et al. | |
| 2008/0217635 A1 | 9/2008 | Emerson et al. | |
| 2009/0008654 A1 | 1/2009 | Nagai | |
| 2009/0072251 A1 | 3/2009 | Chan et al. | |
| 2009/0096386 A1 | 4/2009 | Yeh et al. | |
| 2009/0109151 A1 | 4/2009 | Kim et al. | |
| 2009/0121241 A1 | 5/2009 | Keller et al. | |
| 2009/0129085 A1 | 5/2009 | Aizar et al. | |
| 2009/0261356 A1 | 10/2009 | Lee et al. | |
| 2009/0267085 A1 | 10/2009 | Lee et al. | |
| 2009/0283781 A1 | 11/2009 | Chan et al. | |
| 2009/0283787 A1 | 11/2009 | Donofrio et al. | |
| 2010/0059733 A1 | 3/2010 | Shei et al. | |
| 2010/0155746 A1 | 6/2010 | Ibbetson et al. | |

OTHER PUBLICATIONS

Huang, at al. "High-Performance GaN-Based Vertical Injection Light Emitting Diodes With $TiO_2$-$SiO_2$, Omnidirectional Reflector and n-GaN Roughness", IEEE Photonics Technology Letters, vol. 19, No. 8, Apr. 15, 2007, pp. 565-567.

International Search Report and Written Opinion of International Application No. PCT/US2009/066743 mailed Dec. 4, 2009.

Written Opinion of the International Search Authority for counterpart PCT Application No. PCT/US2009/066743 filed Dec. 14, 2009.

International Search Report and Written Opinion for Patent Application No. PCT/US2011/001741. mailed Feb. 14. 2012.

Final Office Action from U.S. Appl. No. 12/321,059, mailed Sep. 24, 2010.

Response to Final Office Action, U.S. Appl. No. 12/321,059, filed Nov. 23, 2010.

Office Action from U.S. Appl. No. 12/321,059, mailed Feb. 11, 2011.

Response to Office Action, U.S. Appl. No. 12/321,059, filed Jun. 13, 2011.

Office Action U.S. Appl. No. 12/418 816 mailed Apr. 16, 2010.

Response to Office Action U.S. Appl. No. 12/418,816, filed Aug. 11, 2010.

Office Action from U.S. Appl. No. 12/418,816, mailed Oct. 29, 2010.

Response to Office Action U.S. Appl. No. 12/418,816, filed Feb. 28, 2011.

Office Action from U.S. Appl. No. 12/418,816, mailed Aug. 20, 2010.

Response to Office Action U.S. Appl. No. 12/418,816, filed Oct. 20, 2010.

Office Action and Search Report for Chinese Patent Application No. 200980149197.2, dated Nov. 15. 2012.

\* cited by examiner

LIGHT EMITTING DIODE WITH IMPROVED LIGHT EXTRACTION

BACKGROUND

The present invention relates to light emitting devices and in particular to light emitting diodes. Light emitting diodes (LEDs) are a class of photonic semiconductor devices that convert an applied voltage into light by encouraging electron-hole recombination events in an appropriate semiconductor material. In turn, some or all of the energy released in the recombination event produces a photon. When recombination events produce photons, they initiate photons in all directions.

Light emitting diodes share a number of the favorable characteristics of other semiconductor solid-state devices. These include generally robust physical characteristics, long lifetime, high reliability, and, depending upon the particular materials, low cost. These physical characteristics, along with relatively low power requirements, make LEDs desirable as light output devices. The general theory and operation of LEDs are well understood in the art. Appropriate references about the structure and operation of light emitting diodes include S.M. SZE, PHYSICS OF SEMICONDUCTOR DEVICES (2d ed. 1981) and E. FRED SCHUBERT, LIGHT-EMITTING DIODES (2003).

From a practical standpoint, an LED's useful emission is best understood and measured by the amount of light that actually leaves the device and can be externally perceived, a factor that is referred to as the external quantum efficiency (EQE) of the diode. Yet, as stated above, the LED generates photons and initiates them in all directions. Accordingly, maximizing the number of photons that actually exit the device in the direction of the desired transmission of light is a practical goal.

Light emitting diodes typically include multiple layers of different materials. As a result, light emitted from the active portion must typically pass through or across one or more of such layers before exiting the diode. Snell's law dictates that the photons will be refracted as they pass from one material to the next. The angles at which the photons will be refracted will depend upon the difference between the refractive indexes of the two materials and the angle of incidence at which the light strikes the interface.

In a diode, although some reflected light will still escape the diode at some other location, a certain percentage will be totally internally reflected, never escape the diode, and will thus functionally reduce the external efficiency of the diode. Although the individual reduction in the percentage of photons escaping may appear to be relatively small, the cumulative effect can be significant, and diodes that are otherwise very similar can have distinctly different performance efficiencies resulting from even these small percentage losses.

Snell's law dictates that when light crosses an interface into a medium with a higher refractive index, the light bends towards the normal. Similarly, when light travels across an interface from a medium with a higher refractive index to a medium with a lower refractive index, light bends away from the normal. At an angle defined as the critical angle, light traveling from a medium with a higher refractive index to a medium with a lower refractive index will be refracted at an angle of 90°; i.e., parallel to the boundary. At any angle greater than the critical angle, an incident ray undergoes total internal reflection. The critical angle is thus a function of the ratio of the refractive indexes. If the light hits the interface at any angle larger than this critical angle, the light will not pass through to the second medium at all. Instead, the interface reflects the light back into the first medium, a process known as total internal reflection. The loss of light due to this total internal reflection is known as the critical angle loss, and is another factor that reduces the external efficiency of the LED.

The light reflected at the interface of two materials is often called the Fresnel reflection or Fresnel loss. Any difference in the respective optical refractive indexes of the media would result in Fresnel Losses. Hence, Fresnel Loss is another factor contributing to the reduction in the percentage of the total light generated by the LED that the LED emits to air.

Accordingly, a need exists for devices with features that maximize the probability that a particular photon will exit the device in a desired direction or range of directions, thus increasing the light output efficiency of the device.

SUMMARY

In one aspect, the invention is a light emitting diode with an active region and a plurality of exterior surfaces. The exterior surfaces include light enhancement features, selected from the group consisting of reflectors, shaping and texturing. At least one of the surfaces, however, is other than a reflector.

In another aspect, the invention is a light emitting diode that includes a substrate and a Group III nitride active region formed on the substrate. The substrate and the Group III nitride active region define a plurality of exterior surfaces. One of the exterior surfaces has a light enhancement feature selected from the group consisting of shaping and texturing. The remaining exterior surfaces have light enhancement features selected from the group consisting of shaping, texturing, and reflectors.

In a further aspect, the invention is a light emitting diode that includes a substrate and an active region formed on the substrate. The active region has at least one n-type layer and one p-type layer. The light emitting diode includes a plurality of exterior surfaces, at least four of which have light enhancement features selected from the group consisting of shaping, texturing, and reflectors.

DETAILED DESCRIPTION

Figure 1:
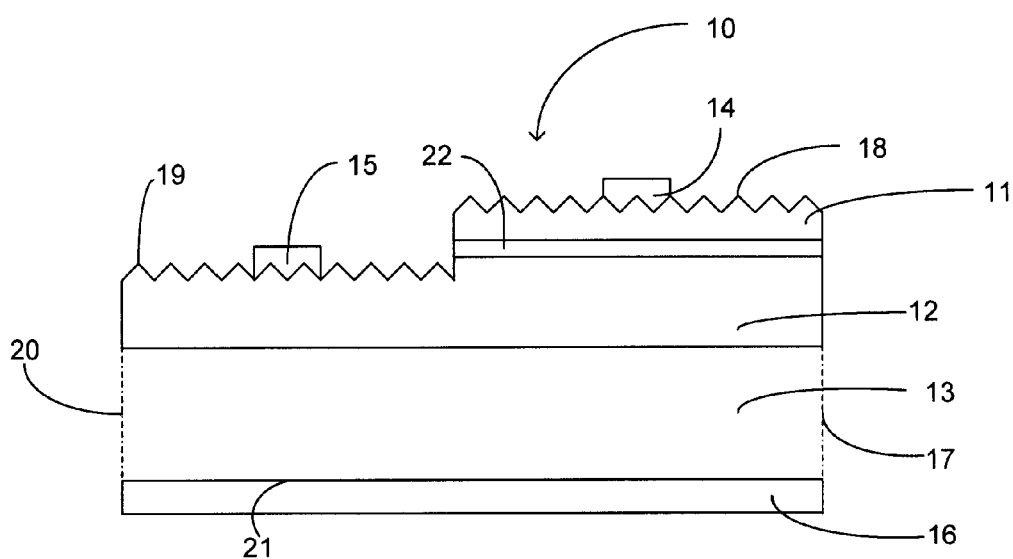
FIGS. 1 through 7 are cross-sectional schematic views illustrating various exemplary embodiments of the present invention.

Expressed broadly, the invention is a light emitting device with improved light output efficiency through the use of a plurality of light enhancement features that are located on the exterior surfaces of the device. A number of aspects of the invention are illustrated in the drawings. In the drawings, the devices are illustrated as light emitting diodes with lateral configurations, but it will be understood that other types of optoelectronic semiconductor devices can utilize some or all of the aspects of the present invention. For descriptive purposes, the LED structures are described in terms of Group III nitrides and silicon carbide, but other materials can be incorporated where appropriate. The use of Group III nitrides and silicon carbide in light emitting diodes is generally well-established in the art and will not be otherwise described in detail.

As is familiar to those in the art, the active region of an LED generates photons when recombination events take place within one or more layers of semiconductor materials. The simplest structure in which this occurs is the p-n junction. Such a p-n junction can comprise the active regions (or active layers) of the LED structures described in this invention. It will nevertheless be understood that the active region can include more complex structures such as single quantum wells, multiple quantum wells, and superlattice structures, as well as structures that include one or more active layers positioned between respective p-type and n-type layers. Thus, although most of the discussions and drawings herein are set forth in terms of simple p-n junctions, it will be understood that in addition to simple p-n junctions the invention can incorporate complex structures and variations therebetween.

As well-understood in this art, in such more complex structures, the active layer (or layers) is often positioned between the p and n-type epitaxial layers. In typical embodiments, the active layer is a multiple-quantum well. As an example, such wells usually include between 2 and 25 periods of alternating layers of gallium nitride (GaN) and indium gallium nitride (InGaN). In many of these, the GaN and InGaN layers in the well are grown without proactive doping. As a result, the layers (although referred to as "undoped") are intrinsically n-type.

FIG. 1 is a schematic cross-sectional diagram of one embodiment of the present invention and is an LED structure broadly designated at 10. A p-layer and an n-layer are illustrated respectively at 11 and 12 with an active layer 22 between them. Combined, the p-layer 11, the active layer 22 and the n-layer 12 form the active region of the LED 10. The p-layer 11 and the n-layer 12 are formed from at least one, and typically several, Group III nitride layers epitaxially grown on a substrate 13. In some embodiments, the substrate 13 is formed from silicon carbide. The substrate may alternatively be formed from sapphire, silicon, metals, or any other material suitable for supporting the p-layer 11 and the n-layer-12 and that does not otherwise interfere with the structure or operation of the LED 10. In some cases, the substrate 13 is a growth substrate; i.e., a material that supports the growth of the p-type and n-type epitaxial layers. In other cases, the substrate 13 is a carrier substrate (or "submount") which is attached to the epitaxial layers after they have been grown elsewhere.

Ohmic contacts, 14 and 15 respectively, provide an electrical connection to the p-layer 11 and the n-layer 12. The ohmic contacts 14 and 15 may be formed from metals such as platinum, nickel, gold, titanium, chromium, aluminum, and silver including alloys of these metals and layers of two or more of these metals. The ohmic contacts 14 and 15 are arranged in a lateral configuration. When the substrate 13 is conductive (e.g., n-type SiC), the ohmic contacts 14 and 15 may alternatively be positioned on axially opposite faces of the LED 10 giving the ohmic contacts 14 and 15 a vertical configuration.

The LED 10 defines a plurality of exterior surfaces, several of which are illustrated at 17, 18, 19, 20, and 21. As used herein, the term "exterior surface" refers to the faces of a solid polygon. LEDs are, of course, solid objects, and thus an LED defines a solid polygon; i.e. a three-dimensional object in which the individual sides are polygons and the polygons are joined to one another along straight lines. Thus, it will be understood that in three dimensions, the LED 10 has other exterior surfaces not visible in FIG. 1.

The LED 10 has a light-enhancement feature selected from the group consisting of shaping and texturing on at least portions of one of the exterior surfaces, and a light-enhancement feature on at least portions of each of the other exterior surfaces selected from the group consisting of shaping, texturing and reflectors.

As used herein, the term "shape" or "shaping" refers to the overall solid geometry of the diode or the surface and includes surfaces that are beveled, rounded, or shaped in some other fashion.

The term "textured" refers to surfaces that have smaller optical features and includes mechanically roughened surfaces (e.g., as from a physical saw or laser cut), crystallographic surfaces (e.g., those developed chemically that reflect the low-integer Miller index ratios of the basic crystal), and lenticular surfaces (e.g., regular, lens-like features). Exemplary crystallographic surfaces are described in co-pending U.S. Patent Application Publication No. 20060186418, and, lenticular surfaces are described in commonly assigned U.S. Pat. No. 7,384,809. The contents of both of these are incorporated entirely herein by reference.

The term "reflectors" refers to metals (e.g., aluminum, silver, or other reflective metals), dielectric reflectors such as a distributed Bragg reflectors (DBRs) and hybrid reflectors that include both metals and dielectric layers.

In FIG. 1, four of the exterior surfaces (17, 18, 19, and 20) have a lenticular surface for enhancing the light output of the LED 10. As used herein, the term lenticular surface refers to a regular pattern of lens-type structures on one or more of the exterior surfaces of the LED 10. A lenticular surface may be formed through photolithography or by using an embossing stamp to imprint the pattern on to an exterior surface. An exemplary (but not limiting) technique for forming lenticular surfaces is set forth in commonly assigned U.S. Pat. No. 7,384,809; the contents of which are incorporated entirely herein by reference.

FIG. 1 also illustrates that one or more of the exterior surfaces can include a reflector to enhance the light output of the LED. In FIG. 1, such a reflector is illustrated at 16 on the bottom (relatively speaking) exterior surface 21 of the LED 10. The reflector 16 may be one or more metallic layers formed from Ag, Al, or any another appropriate metal that does not otherwise interfere with the structure or operation of the LED 10. Alternatively, the reflector 16 may be a dielectric mirror such as a distributed Bragg reflector. The reflector 16 may also be a dielectric mirror formed from alternating layers of $TiO_2$ and $SiO_2$. In other embodiments, the reflector 16 may be composed of both metallic layers and dielectric mirrors. The design and fabrication of such reflectors is well understood by those having ordinary skill in the art and will not be otherwise described in detail.

The exterior surfaces 17, 18, 19, 20, and 21 may in addition or alternatively have light enhancement features such as texturing or a beveled cut, and these features will be described in more detail with respect to FIGS. 3 and 5. In other words, the exterior surfaces 17, 18, 19, 20, and 21 may have one or more light enhancement features such as a reflector, a lenticular surface, a beveled cut, or texturing. Any exterior surface defined by the LED 10 that is not visible in FIG. 1 may also have light enhancement features. It will be further appreciated that any other light enhancement feature that does not interfere with the operation of the LED 10 may be used. Of course, to ensure that the LED 10 emits light, at least one of the exterior surfaces of the LED 10 must be other than a reflector. Stated differently, if all of the exterior surfaces of the LED 10 were reflectors, photons would fail to exit the LED 10.

Certain of the light enhancement features are most practically or efficiently used with certain of the surfaces. For example, when the top surface of the diode is a Group III nitride (e.g., GaN), the preferred top surface enhancement feature is crystallographic (e.g., commonly assigned and co-pending US Patent Application Publication No.

20060060874); or lenticular (e.g., as described elsewhere herein); or a sub-wavelength periodic patterning (or "photonic crystal"); or random pattering that is greater than the wavelength. The relevant wavelength is, of course, the wavelength produced by the diode.

Sidewalls are most efficiently enhanced by being beveled or by being roughened in random manner. Such random roughening can be added (for example) by using a diamond grit during sawing, or when a laser is used to dice a wafer, or by any other appropriate mechanical means.

The bottom or backside of the device is most efficiently enhanced with a lenticular surface, beveled grooves (or other large scale patterning of the type that would be observed when the surface was sawed), and random roughening; for example as would be produced by lapping. As used herein (and generally in this art) the terms "bottom" or "backside" refers to the portion of the diode that is opposite the active layers(s).

Figure 2:
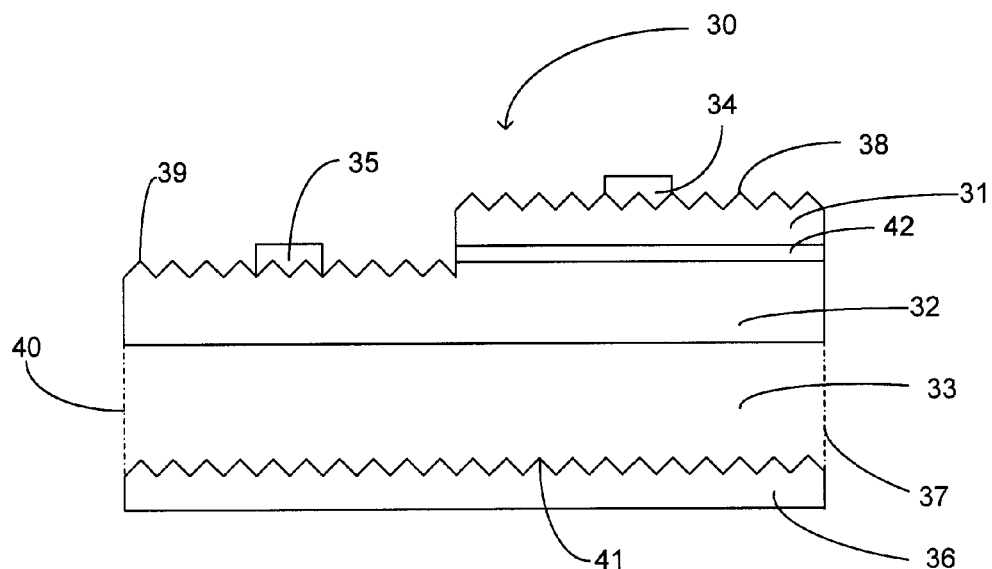

FIG. 2 is a schematic cross-sectional diagram of another embodiment of the present invention and is an LED structure broadly designated at 30, which is substantially similar to the LED 10 depicted in FIG. 1. The LED 30 has a p-layer 31, an active layer 42, and an n-layer 32 on a substrate 33. Ohmic contacts 34 and 35 provide an electrical connection to the p-layer 31 and the n-layer 32 respectively. The LED 30 has a plurality of exterior surfaces, five of which are illustrated in FIG. 2 at 37, 38, 39, 40, and 41. Some of the exterior surfaces (e.g., 37, 38, 39, and 40) have a lenticular surface. One of the exterior surfaces (41) has two light enhancement features, a lenticular surface and a reflector 36.

Figure 3:
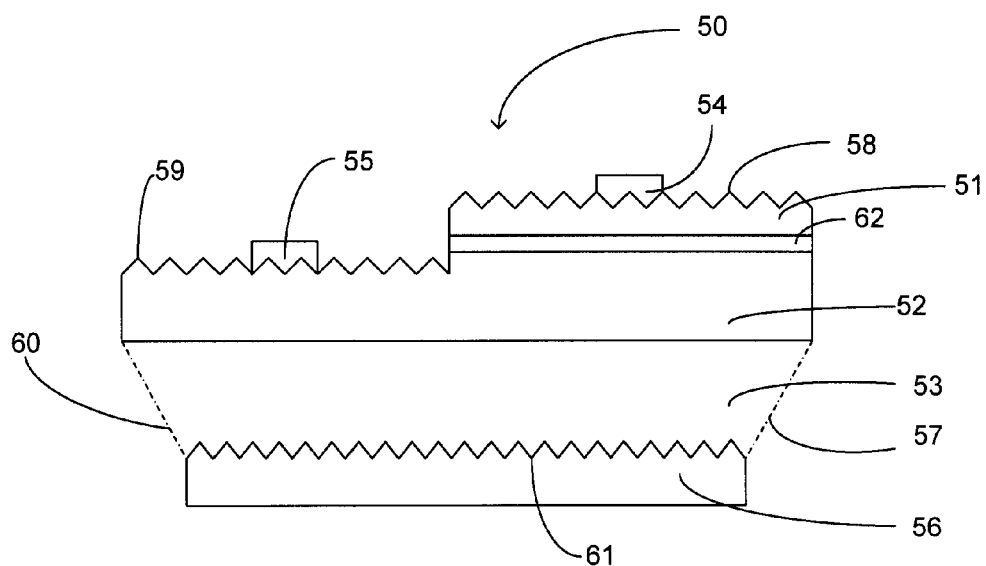

FIG. 3 is a schematic cross-sectional diagram of an LED structure broadly designated at 50, which is similar to the above embodiments of the invention. The LED 50 has a p-layer 51, an active layer 62, and an n-layer 52 on a substrate 53. Ohmic contacts 54 and 55 provide an electrical connection to the p-layer 51 and the n-layer 52 respectively. FIG. 3 illustrates five exterior surfaces at 57, 58, 59, 60, and 61. Of these, two exterior surfaces (58 and 59) have a lenticular surface. Another exterior surface (61) has a lenticular surface and a reflector 56. Two of the other exterior surfaces (57 and 60) have a textured surface and a beveled cut. As used herein, the term "beveled cut" refers to an exterior surface (e.g., 57 or 60) that defines a non-perpendicular angle with respect to the predominant horizontal plane defined by one or more of the epitaxial layers; e.g., the n-layer 52. A beveled cut on an exterior surface, as illustrated in FIG. 3 at 57 and 60, creates an angled surface, where light that might otherwise be trapped by total internal reflection can be emitted. In the broadest sense, such a bevel will define an angle of more than 0° and less than 90° with respect to the epitaxial layers, but most such bevels will form an angle of between about 30° and 60° with respect to the epilayers. In the exemplary embodiments, a diamond saw may be used to create beveled and textured exterior surfaces such as 57 and 60. Alternatively, any other appropriate means may be used to create a beveled cut.

Figure 4:
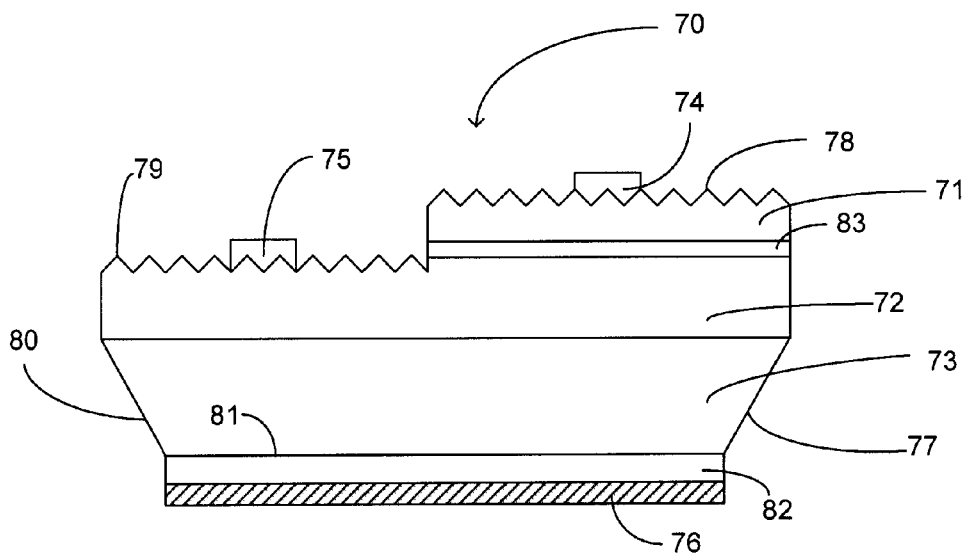

FIG. 4 is a schematic cross-sectional diagram of an LED structure broadly designated at 70, which is similar to the above embodiments of the invention. The LED 70 has a p-layer 71, an active layer 83, and an n-layer 72 on a substrate 73. Ohmic contacts 74 and 75 provide an electrical connection to the p-layer 71 and the n-layer 72 respectively. FIG. 4 illustrates five of the exterior surfaces 77, 78, 79, 80, and 81 of the LED 10. Two of the exterior surfaces (78 and 79) have a lenticular surface. Two other exterior surfaces (77 and 80) have a beveled cut. One of the exterior surfaces 81 has a reflector 76.

As illustrated in FIG. 4, the LED 70 can also include a hybrid reflector formed by a dielectric layer 82 such as silicon dioxide between the substrate 73 and the reflector 76. In exemplary embodiments (which are not limited to the embodiment illustrated in FIG. 4) the dielectric layer 82 provides better reflection than a metal layer (e.g., reflector 76) alone. Based upon the differences in refractive index, silicon dioxide is particularly helpful when the substrate (e.g. 73 in FIG. 4) is silicon carbide.

Figure 5:
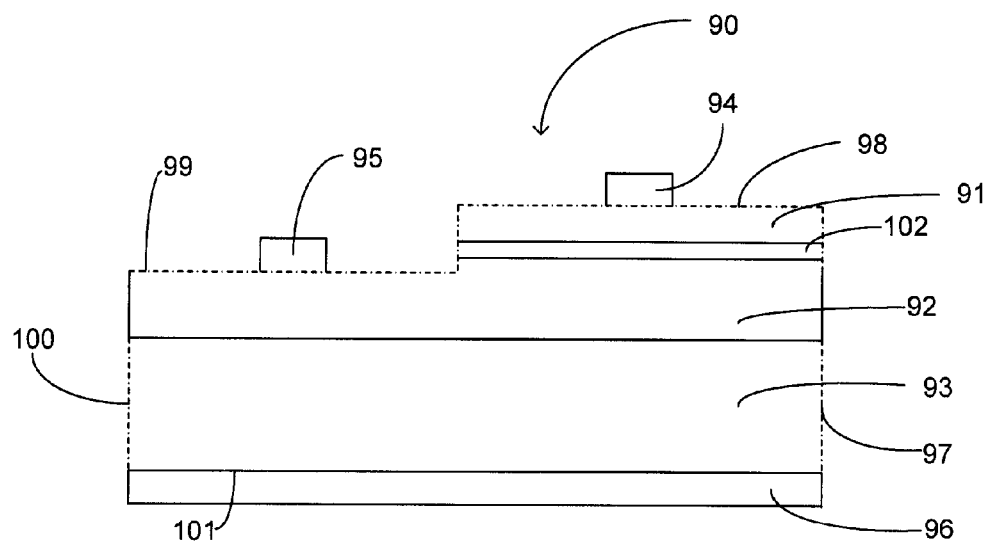

FIG. 5 is a schematic cross-sectional diagram of an LED structure broadly designated at 90, which is similar to the above embodiments of the invention. The LED 90 has a p-layer 91, an active layer 102, and an n-layer 92 on a substrate 93. Ohmic contacts 94 and 95 provide an electrical connection to the p-layer 91 and the n-layer 92 respectively. The cross-sectional view of FIG. 5 illustrates five exterior surfaces 97, 98, 99, 100, and 101. As illustrated by the dotted lines, some of the larger exterior surfaces (97, 98, 99, and 100) are textured, along with the mesa sidewalls (i.e., 103 and 104 on the layers 91, 92 and 102). As used herein, the term "textured" refers to any small, non-planar features on an exterior surface that are to a greater or lesser extent irregular. Based upon Snell's law, such a surface presents photons with a larger number of small surfaces at numerous angles, thus increasing the number of photons that refract (and exit externally) rather than reflect internally. As an example, commonly assigned U.S. Patent Application Publication No. 20060186418 describes a technique for developing crystal facets on the light emitting surfaces of Group III nitride LEDS. The contents of No. 20060186418 are incorporated entirely herein by reference. As another example, commonly assigned U.S. Pat. No. 6,821,804 describes textured surfaces with features that are on the order of a wavelength of light. Such features reflect and refract photons in manners not directly predicted by Snell's law and can improve the overall external efficiency of the LED. The contents of U.S. Pat. No. 6,821,804 are incorporated entirely herein by reference. Such structures and techniques are, of course, exemplary rather than limiting and other chemical or physical techniques can be used provided they avoid negatively affecting other portions of the LED or its function.

As in other embodiments, one of the exterior surfaces 101 has a reflector 96.

Figure 6:
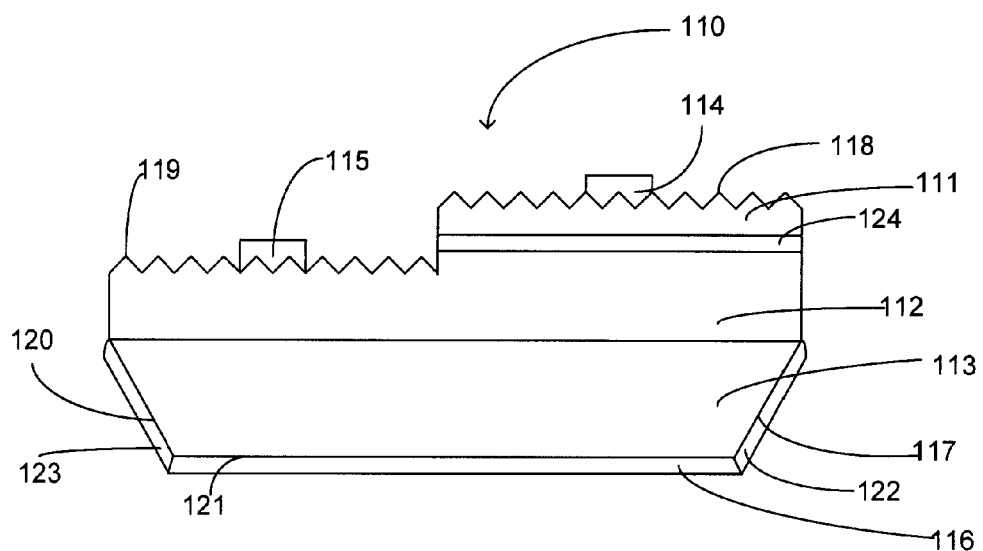

FIG. 6 is a schematic cross-sectional diagram of an LED structure broadly designated at 110, which is similar to the above embodiments of the invention. The LED 110 has a p-layer 111, an active layer 124, and an n-layer 112 on a substrate 113. Ohmic contacts 114 and 115 provide an electrical connection to the p-layer 111 and the n-layer 112 respectively. As in the other embodiments, FIG. 6 illustrates five exterior surfaces 117, 118, 119, 120, and 121. Two of the exterior surfaces (118 and 119) are lenticular and two of the exterior surfaces (117 and 120) have a beveled cut. Three of the exterior surfaces (117, 120, and 121) have reflectors, 122, 123, and 116 respectively.

Figure 7:
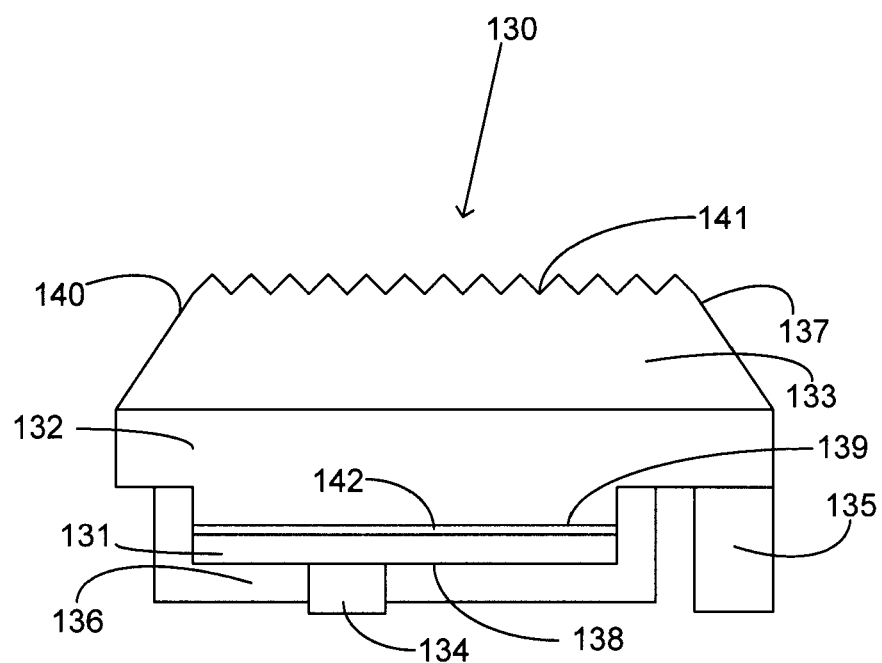

FIG. 7 is a perspective cross-sectional view of a lateral flip chip design according to the present invention. In FIG. 7, the diode is broadly designated at 130. The substrate 133 forms the emitting face of the diode 130 and includes a light extraction enhanced surface 141 which is illustrated as being lenticular, but which also can be any of the other enhancement features appropriate for that surface. The substrate 133 includes the beveled side edges 137 and 140.

A p-type layer 131, an active layer 142, and an n-type layer 132 are illustrated as forming the light emitting portions of the diode 130. The respective surfaces 139 of the n-type layer and 138 of the p-type layer can include any of the enhancement features previously described. An appropriate ohmic contact 134 (and potentially including bond pad metals in a generally well understood fashion) is made to the p-type layer 131 and an n-type ohmic contact 135 is made to the p-type layer 132.

A reflector generally designated at 136 covers the p-type layer 131 with the exception of the portion occupied by the p-type ohmic contact 134. As in other embodiments of the invention, the reflector 136 can be a distributed Bragg refractor, and can also potentially include at least one metal layer (not shown) to increase the range of frequencies reflected.

Although prior devices have broadly included numerous surfaces that include mirrors, bevels, and lapped edges, these have generally been limited to vertical structure chips mounted with the epitaxial side down; i.e., in a flip-chip orientation with the epitaxial layers positioned nearest the mounting structure and with the substrate facing in the preferred direction of light emission. From a light extraction efficiency standpoint such vertical devices can suffer from the absorbing nature of both the n-type contact on the substrate (which is typically silicon carbide) and of the highly doped silicon carbide substrate itself. As another disadvantage of the previous structures, when thin wafers are incorporated, the laser annealing (e.g., US patent Application Publication No. 20050104072) used to form the ohmic contact on the silicon carbide also tends to increase the absorption and further limits the advantages of a reflective layer.

In lateral-design embodiments of the invention, the contacts on the epitaxial layers can be made with metals that offer greater reflectivity (such as aluminum). The lateral design embodiments can also incorporate the reduced conductivity regions in a p-type layer that are congruent with nearby more opaque features, such as the ohmic contact to the p-layer (e.g., commonly assigned US Patent Application Publication No. 20080217635, the contents of which are incorporated entirely herein by reference).

As another factor, when transparent silicon carbide is used as the device substrate, its transparency can be defined by the resistivity range of the solid carbide; i.e., in most cases, silicon carbide crystals that contain fewer dopant atoms (and thus have a higher resistivity) will exhibit greater transparency than SiC crystals with more dopant atoms (higher conductivity). Vertical devices generally require higher conductivity substrates. In vertical designs the required higher conductivity substrates tend to absorb more light and thus reduce the external efficiency of the diode.

Thus, as another advantage, the lateral designs disclosed herein do not require conductive substrates. As a result, these lateral designs can incorporate more transparent (i.e., high resistivity) substrates while still demonstrating good forward voltage characteristics.

Lateral designs also provide more options for positioning any desired mirror layer and the lateral design chips can be mounted with the epitaxial layers up or down (i.e., closest to the mounting structure with respect to the substrate or further from the mounting structure with respect to the substrate). In circumstances where the epitaxial layers are placed on the mounting structure ("down"), the mirror can be positioned on the epitaxial side of the overall device.

Although the invention offers advantages with respect to lateral design diodes, aspects of the invention can enhance the external efficiency of vertical design diodes. This is particularly true for designs in which an epitaxial layer represents the emitting face of the diode (i.e., when the epitaxial layers are "up"). In such designs, the epitaxial layer carries the light enhancement feature. In these vertical designs, the mirror is then necessarily positioned on the backside of the device or the sidewalls or both, but (of course) never on the emitting face. In such vertical designs, the sidewalls can be beveled or roughened as otherwise set forth herein.

The light enhancement designs described herein offer additional advantages based upon the refractive index of silicon carbide. Specifically, the difference between the refractive index of silicon carbide and air, and between silicon carbide and most common encapsulants, is usually greater than the difference between the refractive index of other substrate materials (such as sapphire) and air or encapsulants. As a result, silicon carbide tends to refract and internally reflect more light than do some other substrate materials. Because of that, enhancing the light output characteristics of the surfaces of silicon carbide-based diodes has a proportionally greater positive effect on the external quantum efficiency of these devices.

As the drawings indicate, the invention can also be described as a light emitting diode with a plurality of exterior surfaces in which at least four of the exterior surfaces have light enhancement features selected from the group consisting of beveled cuts, texturing, lenticular surfaces and reflectors. In some cases, and depending upon the diode structure and the nature of the substrate and the epitaxial layers, at least six exterior surfaces can have such light enhancement features and in other embodiments at least eight exterior surfaces can have such light enhancement features.

As in the other embodiments, at least one of the exterior surfaces carries a light enhancement feature that is something other than a reflector. As noted earlier, providing a reflector on all exterior surfaces would be meaningless because such a structure would prevent any light whatsoever from leaving the diode.

In the drawings and specification there have been set forth preferred embodiments of the invention, and although specific terms have been employed, they are used in a generic and descriptive sense only and not for purposes of limitation, the scope of the invention being defined in the claims.

The invention claimed is:

1. A light emitting diode comprising:
   a plurality of exterior surfaces;
   a light enhancement feature on at least portions of a first one of said exterior surfaces of said diode, said light enhancement feature being selected from the group consisting of shaping and texturing;
   a light enhancement feature on at least portions of at least two of each of the other exterior surfaces of said diode, wherein said other exterior surfaces are at least partially integral to components of said light emitting diode that are distinct from the diode component integral to said first exterior surface, said light enhancement features being selected from the group consisting of shaping, texturing, and reflectors;
   ohmic contacts in a lateral orientation, each of said ohmic contacts on a first side of said light emitting diode, each of said ohmic contacts on a respective one of the exterior surfaces having a light enhancement feature;
   an active region formed from the Group III nitride material system;
   wherein one of said light enhancement features comprises a reflector; and
   wherein one of said exterior surfaces is on the bottom of said light emitting diode.

2. A light emitting diode according to claim 1 further comprising a substrate supporting said active region.

3. A light emitting diode according to claim 2 wherein said substrate is selected from the group consisting of SiC, sapphire, silicon, and metals.

4. A light emitting diode according to claim 1 wherein said active region includes at least one Group III nitride epitaxial layer; and
wherein at least one light enhancement feature on one of said exterior surfaces is a beveled cut in which said exterior surface defines a non-perpendicular angle with respect to said Group III nitride epitaxial layer.

5. A light emitting diode according to claim 1 wherein one or more of said exterior surfaces include at least two different light enhancement features.

6. A light emitting diode according to claim 1 wherein at least one exterior surface includes a reflector.

7. A light emitting diode according to claim 6 wherein said reflector comprises one or more metal layers.

8. A light emitting diode according to claim 6 wherein said reflector includes a plurality of dielectric layers.

9. A light emitting diode according to claim 8 wherein said reflector further includes one or more metal layers.

10. A light emitting diode according to claim 1 wherein at least one of said light enhancement features is a textured feature selected from the group consisting of mechanically textured features, crystallographic features, and lenticular features.

11. A light emitting diode according to claim 10 wherein said textured surface comprises a random pattern having features on the order of a wavelength of light.

12. A light emitting diode according to claim 1 wherein at least one of said light enhancement features comprises a lenticular surface.

13. A light emitting diode comprising:
a plurality of exterior surfaces;
a light enhancement feature on at least portions of a first one of said exterior surfaces of said diode, said light enhancement feature being selected from the group consisting of shaping and texturing;
a light enhancement feature on at least portions of at least two of each of the other exterior surfaces of said diode, wherein said other exterior surfaces are at least partially integral to components of said light emitting diode that are distinct from the diode component integral to said first exterior surface, said light enhancement features being selected from the group consisting of shaping, texturing, and reflectors, wherein each exterior surface includes a single light enhancement feature;
ohmic contacts in a lateral orientation, each of said ohmic contacts on a first side of said light emitting diode, each of said ohmic contacts on a respective one of the exterior surfaces having a light enhancement feature;
wherein one of said light enhancement features comprises a reflector; and
wherein at least one of said exterior surfaces is below a substrate.

14. A light emitting diode comprising:
a substrate;
a Group III nitride active region formed on said substrate, wherein said active region comprises at least one n-type layer and one p-type layer;
said substrate and said Group III nitride active region defining a plurality of exterior surfaces;
one of said exterior surfaces having a light enhancement feature selected from the group consisting of shaping and texturing;
the remainder of said exterior surfaces having light enhancement features selected from the group consisting of shaping, texturing, and reflectors;
ohmic contacts in a lateral orientation on a first surface of said active region, each of said ohmic contacts on a respective one of the exterior surfaces having a light enhancement feature;
wherein at least one light enhancement feature on one of said exterior surfaces is a shaped beveled cut in which said exterior surface defines a non-perpendicular angle with respect to said n-type layer; and
wherein at least one of said exterior surfaces is below said substrate.

15. A light emitting diode according to claim 14 wherein said active region further comprises:
an ohmic contact to said n-type layer and an ohmic contact to said p-type layer.

16. A light emitting diode according to claim 14 wherein each exterior surface includes a single light enhancement feature.

17. A light emitting diode according to claim 14 wherein one or more of said exterior surfaces include at least two different light enhancement features.

18. A light emitting diode according to claim 14 wherein at least one exterior surface includes a reflector.

19. A light emitting diode according to claim 18 wherein said reflector is on said substrate opposite said active region.

20. A light emitting diode according to claim 18 wherein said reflector comprises one or more metal layers.

21. A light emitting diode according to claim 18 wherein said reflector includes a plurality of dielectric layers.

22. A light emitting diode according to claim 14 wherein at least one of said light enhancement features comprises texturing.

23. A light emitting diode according to claim 22 where said texturing creates a random pattern having features on the order of a wavelength of light.

24. A light emitting diode according to claim 14 wherein at least one of said light enhancement features comprises a lenticular surface.

25. A light emitting diode according to claim 14 wherein said substrate is selected from the group consisting of SiC, sapphire, silicon, and metals.

26. A light emitting diode comprising:
an active region having at least one n-type layer and one p-type layer wherein said active region includes at least one Group III nitride epitaxial layer;
a plurality of exterior surfaces;
at least four of said exterior surfaces having light enhancement features selected from the group consisting of beveled cuts, texturing, lenticular surfaces, and reflectors;
ohmic contacts in a lateral orientation, each of said ohmic contacts on a first surface of said active region, each of said ohmic contacts on a respective one of the exterior surfaces having a light enhancement feature; and
wherein one of said exterior surfaces is on the bottom of said light emitting diode.

27. A light emitting diode according to claim 26 wherein at least two of said surfaces with light enhancement features form angles of between 0° and 90°.

28. A light emitting diode according to claim 26 wherein at least two of said surfaces with light enhancement features form angles of between 30° and 60°.

29. A light emitting diode according to claim 26 wherein at least six of said exterior surfaces have light enhancement features selected from the group consisting of shaping, texturing, and reflectors.

30. A light emitting diode according to claim 26 having at least eight exterior surfaces that have light enhancement features selected from the group consisting of shaping, texturing, and reflectors.

31. A light emitting diode according to claim 26 wherein at least one light enhancement feature on one of said exterior surfaces is a beveled cut in which said exterior surface defines a non-perpendicular angle with respect to said Group III nitride epitaxial layer.

32. A light emitting diode according to claim 26 wherein one or more of said exterior surfaces include at least two different light enhancement features.

33. A light emitting diode according to claim 26 wherein at least one of said exterior surfaces includes a reflector.

34. A light emitting diode according to claim 26 wherein at least one of said light enhancement features comprises texturing.

35. A light emitting diode according to claim 34 wherein said texturing creates a random pattern having features on the order of a wavelength of light.

36. A light emitting diode according to claim 34 wherein at least one of said light enhancement features comprises a lenticular surface.

37. A light emitting diode according to claim 26 further comprising a substrate selected from the group consisting of SiC, sapphire, silicon, and metals.

38. A light emitting diode comprising:
a plurality of exterior surfaces;
an active region formed from the Group III nitride material system;
ohmic contacts in a lateral orientation, each of said ohmic contacts on a first side of said light emitting diode;
at least one light enhancement feature on at least portions of at least two of said exterior surfaces of said diode, each of said ohmic contacts on a respective one of the exterior surfaces having a light enhancement feature;
wherein one of said light enhancement features comprises a reflector; and
wherein one of said exterior surfaces is on the bottom of said light emitting diode.

39. The light emitting diode of claim 38 wherein said light enhancement features comprise shaped surfaces.

40. The light emitting diode of claim 38 wherein said light enhancement features comprise textured surfaces.

41. The light emitting diode of claim 39 wherein said light enhancement features comprise reflectors.

42. The light emitting diode of claim 38 wherein said light enhancement features comprise a combination of at least two of shaped surfaces, textured surfaces, and reflectors.

43. A light emitting diode comprising:
a substrate;
an active region formed on said substrate, wherein said active region comprises at least one n-type layer and one p-type layer;
said substrate and said active region defining a plurality of exterior surfaces;
one of said exterior surfaces having a light enhancement feature selected from the group consisting of shaping and texturing;
the remainder of said exterior surfaces having light enhancement features selected from the group consisting of shaping, texturing, and reflectors;
ohmic contacts in a lateral orientation on a first surface of said active region, each of said ohmic contacts on a respective one of the exterior surfaces having a light enhancement feature;
wherein at least one light enhancement feature on one of said exterior surfaces is a shaped beveled cut in which said exterior surface defines a non-perpendicular angle with respect to said active region; and
wherein at least one of said exterior surfaces is below said substrate.

44. A light emitting diode according to claim 43 wherein at least one exterior surface includes a reflector.

* * * * *